United States Patent
Pinto et al.

(10) Patent No.: US 8,846,487 B2
(45) Date of Patent: Sep. 30, 2014

(54) REDUCTION OF STI CORNER DEFECTS DURING SPE IN SEMICONDUCTOR DEVICE FABRICATION USING DSB SUBSTRATE AND HOT TECHNOLOGY

(75) Inventors: Angelo Pinto, San Diego, CA (US); Periannan R. Chidambaram, Richardson, TX (US); Rick L. Wise, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/544,519

(22) Filed: Jul. 9, 2012

(65) Prior Publication Data

US 2013/0029471 A1 Jan. 31, 2013

Related U.S. Application Data

(63) Continuation of application No. 12/637,279, filed on Dec. 14, 2009, now abandoned, which is a continuation of application No. 11/847,053, filed on Aug. 29, 2007, now abandoned.

(51) Int. Cl.
| | |
|---|---|
| H01L 21/76 | (2006.01) |
| H01L 21/8238 | (2006.01) |
| H01L 21/84 | (2006.01) |
| H01L 21/762 | (2006.01) |
| H01L 29/04 | (2006.01) |

(52) U.S. Cl.
CPC .. *H01L 21/76275* (2013.01); *H01L 21/823878* (2013.01); *H01L 21/84* (2013.01); *H01L 21/823807* (2013.01); *H01L 21/76283* (2013.01); *H01L 29/045* (2013.01)
USPC ................................... 438/424; 257/E21.551

(58) Field of Classification Search
USPC .......................... 438/221, 424; 257/E21.551
See application file for complete search history.

(56) References Cited

U.S. PATENT DOCUMENTS

| | | | |
|---|---|---|---|
| 6,074,932 | A | 6/2000 | Wu |
| 6,350,662 | B1 | 2/2002 | Thei et al. |
| 6,368,940 | B1 | 4/2002 | Amon et al. |
| 6,468,853 | B1 | 10/2002 | Balasubramanian et al. |
| 2006/0244068 | A1 | 11/2006 | Desouza et al. |
| 2006/0276011 | A1 | 12/2006 | Fogel et al. |
| 2007/0108528 | A1 | 5/2007 | Anderson et al. |
| 2008/0237809 | A1 | 10/2008 | Huang et al. |

FOREIGN PATENT DOCUMENTS

KR 1020070020288 2/2007

*Primary Examiner* — Daniel Luke
(74) *Attorney, Agent, or Firm* — Alan A. R. Cooper; Frederick J. Telecky, Jr.

(57) ABSTRACT

A device and method of reducing residual STI corner defects in a hybrid orientation transistor comprising, forming a direct silicon bonded substrate wherein a second silicon layer with a second crystal orientation is bonded to a handle substrate with a first crystal orientation, forming a pad oxide layer on the second silicon layer, forming a nitride layer on the pad oxide layer, forming an isolation trench within the direct silicon bonded substrate through the second silicon layer and into the handle substrate, patterning a PMOS region of the direct silicon bonded substrate utilizing photoresist including a portion of the isolation trench, implanting and amorphizing an NMOS region of the direct silicon bonded substrate, removing the photoresist, performing solid phase epitaxy, performing a recrystallization anneal, forming an STI liner, completing front end processing, and performing back end processing.

22 Claims, 11 Drawing Sheets

REDUCTION OF STI CORNER DEFECTS DURING SPE IN SEMICONDUCTOR DEVICE FABRICATION USING DSB SUBSTRATE AND HOT TECHNOLOGY

This is a continuation of U.S. application Ser. No. 12/637,279, filed Dec. 14, 2009, which is a continuation of U.S. application Ser. No. 11/847,053 filed Aug. 29, 2007, the entireties of both of which are incorporated herein by reference.

FIELD OF INVENTION

The invention relates generally to semiconductor devices and more particularly to methods for reducing corner defects generated during SPE in shallow trench isolation in the manufacture of semiconductor devices.

BACKGROUND

Complementary metal oxide semiconductor (CMOS) devices (e.g., NMOS or PMOS transistors) have conventionally been fabricated on semiconductor workpieces with a single crystal orientation (e.g., silicon having a Miller index (100)). Transistors within the CMOS devices, for example, are used in cell phones, laptop computers, etc., requiring greater speed, lower power consumption, higher reliability, and the like. The speed of the devices can be improved by increasing electron mobility, hole mobility, or both, using hybrid orientation technology (HOT). Electron mobility/movement for NMOS devices, for example, is high (e.g., 2-4 times higher) when the NMOS devices are built on a Miller index (100) substrate, however the hole mobility for PMOS devices is enhanced when the PMOS devices are fabricated on a Miller index (110) substrate. As a result, PMOS devices formed on a Miller index (110) surface will exhibit significantly higher drive currents than PMOS devices formed on a Miller index (100) surface. In other words, there is a desire to exploit the substrate orientation with Miller index (110) for pFETs and Miller index (100) for nFETs, for example. Previous endeavors to take advantage of this difference between NMOS and PMOS devices has resulted in hybrid substrates with different surface orientations using workpiece composites to optimize the crystalline orientation of the NMOS and PMOS devices, for example.

Direct silicon bonded (DSB) substrates are fabricated by chemo-mechanically bonding a film of single-crystal silicon of a first crystal orientation onto a base substrate having a different or second crystal orientation. Unlike, silicon-on-insulator (SOI) substrates, DSB substrates demonstrate "bulk-like" properties.

The industry continues to seek new approaches to "force" electric charges to move at faster rates through the semiconductor device channels in an endless pursuit of increased circuit speeds and power consumption reductions. The ever decreasing size and scale of semiconductor device technology has presented numerous challenges. For example, gate leakage current due to sharp corner effects in thin silicon gate oxide is a more pronounced problem with smaller devices. These sharp features can also increase stresses, produce large electric fields, create dislocations in the silicon, and ultimately fail the device, for example.

Crystallographic planes are significant in both the semiconductor characteristics and applications since different crystallographic planes can exhibit significantly diverse physical properties. For example, surface density of atoms (i.e., atoms/cm$^2$) on various crystallographic planes can differ substantially from each other. One of the standard notations for the various planes is the Miller indices that are used to denote the crystallographic planes and the directions normal to those planes. The general crystal lattice is represented by a set of unit vectors (e.g., a, b, and c) such that an entire crystal can be replicated by copying the unit cell of the crystal and duplicating it at a given integer offset along the unit vectors. For example, reproducing the basic cell at positions $(n_a)a+(n_b)b+(n_c)c$, wherein $n_a$, $n_b$, and $n_c$ are integers. It is not a requirement that the unit vectors be orthogonal.

FIGS. 1-3 show cubic crystals, with basic vectors in the x, y, and z directions. Superimposed on the three crystal lattices are three different planes indicated by the gray surface "partial planes". The planes are shown in relation to the crystal axes x, y, and z by a set of three integers (e.g., $(i_1 i_2 i_3)$) where $i_1$ corresponds to the crystal plane's intercept with the x-axis, $i_2$ corresponds to the plane's intercept with the y-axis and $i_3$ corresponds to the plane's intercept with the z-axis. Given that parallel planes are equivalent planes, the intercept integers are reduced to the set of the three smallest integers having the same ratios as the above intercepts. The Miller index (100), (010) and (001) planes correspond to the faces of a cube. The (111) plane intercepts the x, y, and z axis at 1, 1, and 1 respectively, and the plane is tilted with respect to the cube faces. In representing a negative axis intercept, the corresponding Miller index is given as an integer and a bar over the integer, similar to the (100) plane but intersecting the x axis at −1 instead of 1, for example.

Amorphization templated recrystallization (ATR) is an approach for providing planar hybrid orientation substrates. Silicon is easily amorphized by ion implantation and easily recrystallized by a subsequent annealing. FIGS. 4-10 outline examples of ATR methods for producing hybrid orientation silicon substrates. FIGS. 4-6 describe an ATR method for forming a bulk semiconductor hybrid orientation technology (HOT) substrate. FIG. 4 shows a starting substrate 400 comprising a lower single crystal semiconductor substrate 402 having a first crystal orientation (100) (Miller Index plane) in direct contact with an upper second single crystal semiconductor layer 404 having a second crystal orientation (110) different from the first orientation. The interface 406, which is located between the semiconductor layers 402 and 404, is typically formed by a workpiece bonding process (e.g., direct silicon bonded (DSB) substrate) that is normally hydrophilic. The structure in FIG. 4 is often referred to as a mixed orientation DSB wafer or DSB workpiece. The fabrication of the mixed orientation DSB workpiece is well known by those of ordinary skill in the art.

FIG. 5 illustrates a structure 500 which results after the mixed orientation direct silicon bonded structure of FIG. 4 is subjected to ion implantation 502 in selected areas to create localized amorphization regions 504 extending from the top surface of semiconductor layer 404 to a depth ending in the substrate layer 402 below the interface 406. During anneal, the amorphized silicon will recrystallize to match the orientation of the crystalline silicon with which it is in contact. It should be noted that this process can be implemented, for example, with the Miller Index (MI) (100) layer on top and the MI (110) layer on the bottom as opposed to the illustrated approach.

Subsequently, FIG. 6 shows a structure 600 which results from the structure of FIG. 5 after localized amorphization regions 504 (FIG. 5) have been recrystallized, with the semiconductor layer 402 as a template, to form a single crystal semiconductor region 602 with the orientation of first semiconductor 402 (FIG. 5). The resulting substrate now comprises two clearly defined single-crystal semiconductor regions with different surface orientations, e.g., non-amorphization regions 404 of the second semiconductor layer and amorphization/recrystallized regions 602. However, it should be noted that end-of-range defects 408 remain in the structure at an approximate depth based upon the implantation energy. These defects 408 are well known by those of ordinary skill in the art.

FIGS. 7-10 illustrate yet another example of a conventional ATR method for producing a semimconductor-on-insulator (SOI) hybrid orientation substrate. FIG. 7 shows a starting substrate structure 700 comprising a handle substrate 702, an insulator layer 704, and a first single crystal semiconductor layer 706 having a first crystal orientation in direct contact with a second single crystal semiconductor layer 708 having a second crystal orientation different from the first. The interface 710 between semiconductor layers 706 and 708 is typically formed by a workpiece bonding process.

FIG. 8 shows a structure 800 which results when the structure of FIG. 7 is subjected to ion bombardment 802 in selected areas to create localized amorphization regions 804 extending from the top surface of insulator layer 704 up to and ending in semiconductor layer 708 above interface 710. FIG. 9 shows a structure 900 which results from the structure of FIG. 8 after localized amorphization regions 804 have been recrystallized, using semiconductor layer 708 as a template to form single crystal semiconductor region 902 (FIG. 9) with the orientation of upper semiconductor 708. Upper semiconductor layer 708 is then removed by a process (for example, polishing, oxidation/wet etching, or the like) to produce substrate 1000 of FIG. 10. Substrate 1000 comprises two clearly defined single-crystal semiconductor regions with different surface orientations, e.g., non-amorphization regions 706 of the second semiconductor layer and amorphization recrystallization region 1004, on the insulator layer 704. Regions 706 and 1004 may be further thinned (again by processes such as polishing and/or oxidation/wet etching), if thinner semiconductor-on-insulator structures are desired.

FIGS. 11-13 represent a conventional approach to forming a CMOS hybrid orientation device utilizing amorphization templated recrystallization (ATR) prior to shallow trench isolation (STI) formation. FIG. 11 shows a starting mixed orientation direct silicon bonded substrate 1100 comprising a lower single crystal semiconductor substrate 1102 having a first crystal orientation (100) in direct contact with an upper second single crystal semiconductor layer 1104 having a second crystal orientation (110) (e.g., Miller Index) different from the first orientation. The interface 1106, which is located between the semiconductor layers 1102 and 1104, is typically formed by a workpiece bonding process. The workpiece bonding process is well known by one of ordinary skill in the art.

FIG. 12 illustrates a photoresist layer 1202 patterned on the PMOS region of device 1200, as shown in FIG. 11. The device 1200 is then subjected to ion implantation 1204 in the selected areas to create localized amorphization regions 1206 extending from below the lower surface of semiconductor layer 1104 within the first silicon layer 1102 to the top of the substrate layer 1104. The ion implantation 1204 can, for example, comprise silicon, germanium, and the like.

Subsequently, FIG. 13 shows the structure of FIG. 12 after localized amorphization regions 1206 have been recrystallized, with the semiconductor layer 1102 acting as a template, to form a single crystal semiconductor region 1302 with the orientation of first semiconductor 1102. The resulting substrate 1300 now comprises two clearly defined single-crystal semiconductor regions with different surface orientations, e.g., non-amorphization region 1104 of the second semiconductor layer and amorphization/recrystallized region 1302. In other words, the PMOS region maintains the original orientation (110) DSB layer 1104 and (100) bulk workpiece control. The ATR layer 1206 (FIG. 12) of the NMOS has been changed, for example, from first crystalline orientation (110) to second crystalline orientation (100). An STI 1306 can then formed, as shown. The formation of the STI 1306 is well known by those of ordinary skill in the art. The amorphized layer 1206 (FIG. 12) can be redone utilizing a solid phase epitaxy (SPE) process 1304 to align the buffer layer 1302 to the (100) surface 1102, so that the buffer layer 1302 becomes a (100) surface, as illustrated.

FIG. 14A is provided to show a transmission electron microscopy (TEM) image of border region defects, with the cut perpendicular to the workpiece notch prior to the formation of the STI. FIG. 14A illustrates a defect 1402 that occurs in the prior art method illustrated in FIGS. 11-13, for example during the "recrystallization process." As the amorphized layer 1206 is redone utilizing the SPE process 1304, the layer 1408 wants to grow vertically as it is transformed from an amorphized (110) crystal to a (100) crystal during SPE. The (110) layer 1406 that has not been amorphized wants to grow laterally during SPE, thereby forming a defect 1402 shown in device 1400. As shown in FIGS. 14A and 14B, the workpiece 1410 is cut or cross-sectioned perpendicular to the workpiece notch 1412. As discussed, there is competition between the horizontal/lateral templating (110) and the vertical templating (100) as shown, wherein the crystallographic planes ((100) and (110)) cause the residual corner defects 1402, as illustrated in FIG. 14A. Subsequent STI trenches and STI can be formed that replace the angular morphology 1404 containing the defects 1402. However, the angular morphology 1404 has a given width and the STI width can be very small, and it may not be possible to replace all of the defects in the angular morphology 1404 with a given STI. FIG. 14B illustrates the workpiece 1410, workpiece notch 1412 and notch orientation 1414, wherein the workpiece 1410 is cut in cross-section with orientation 1416, as shown, perpendicular to the notch orientation 1414.

As illustrated for the device 1500 in FIGS. 15A and 15B, the workpiece 1510 is cut or cross-sectioned parallel to the workpiece notch 1512. There is competition between the horizontal/lateral templating (110) in area 1506 and the vertical templating (100) of area 1508 as shown, wherein the crystallographic planes ((100) 1508 and (110) 1506) cause the residual corner defects 1502, as illustrated in FIG. 15A. As mentioned above, subsequent STI can be formed to replace the angular morphology 1504 containing the defects 1502 shown in FIG. 15A. As discussed, the angular morphology has a given width for a given process and the STI width is or can be very small and it may not be possible to replace all of the defects 1502 in the angular morphology 1504 with a given STI width. FIG. 15B illustrates the workpiece 1510, workpiece notch 1512 and notch orientation 1514 wherein the workpiece 1510 is cut in cross-section orientation 1516, as shown, parallel to the notch orientation 1514. These illustrations clearly show the issues/problems/defects that are present with the conventional approach to performing ATR prior to STI formation. These defects can and have been corrected with extremely high temperature anneals (e.g., greater than 1250 degrees Celsius); however those temperatures can cause other defects, such as large stresses that can warp the workpiece, and the like.

FIGS. 16-18 represent a second conventional approach to forming a CMOS hybrid orientation device utilizing amorphization templated recrystallization (ATR) after STI formation. FIG. 16 shows a starting device 1600 comprising a lower single crystal semiconductor substrate 1602 having a first crystal orientation (100) in direct contact with an upper second single crystal semiconductor layer 1604 having a second crystal orientation (110) (e.g., Miller Index) different from the first orientation. As discussed above, the interface 1606, which is located between the semiconductor layers 1602 and 1604, is typically formed by a workpiece bonding process, e.g., DSB. Workpiece bonding processes are well known by those of ordinary skill in the art and all are contemplated herein.

FIG. 17 illustrates a device 1700 with an STI 1702 formed into and through the (110) Miller index layer 1604 and into a portion of the (100) handle substrate 1602, for example. The formation of the STI 1702 is well known by those of ordinary skill in the art. A photoresist layer 1704 is subsequently patterned on the PMOS region of the device 1700, as shown in FIG. 17. The device 1700 is then subjected to ion implantation 1706 in the selected areas to create localized amorphization regions 1708 extending from below the lower surface of semiconductor layer 1604 within the first silicon layer (100) 1602 to the top of the substrate layer 1604. The ion implantation 1706 can, for example, comprise silicon, germanium, and the like.

FIG. 18 shows the device of FIG. 17 after localized amorphization regions 1708 (FIG. 17) have been recrystallized, with the semiconductor layer 1602 acting as a template, to form a single crystal semiconductor regions (100) 1602 and 1806, both with the orientation of first semiconductor (100). The resulting device 1800 now comprises two clearly defined single-crystal semiconductor regions with different surface orientations, e.g., non-amorphization regions (110) 1604 of the second semiconductor layer and amorphization/recrystallized regions 1806. The amorphized layer 1708 (FIG. 17) can be redone utilizing a solid phase epitaxy (SPE) process 1804 to align the buffer layer 1708 (FIG. 17) to the (100) surface/layer 1602, so that the buffer layer 1708 becomes a (100) surface/layer, as illustrated. Advantages of this approach include no lateral templating; however there are trench edge and corner defects created using this technology from vertical templating and the like. The defects are created when the uniform recrystallization stops on the (111) plane (FIG. 3) because the (111) plane meets the surface of the STI at, for example, 54 degrees.

FIG. 19 shows an example transmission electron microscopy (TEM) image of border region defects of a device 1900, with the TEM cut parallel to the workpiece notch. FIG. 19 illustrates common defects 1902 that occur in angular morphology 1904 with the conventional method illustrated in FIGS. 16-18. As the amorphized layer 1708 (FIG. 17) is redone utilizing the SPE process 1804 (FIG. 18), the surface of the STI 1702 restrains the crystals from regrowing in an unrestrained manner.

Accordingly, there is a need for improved semiconductor processes and devices to overcome the problems in the art, such as outlined above.

SUMMARY

In one aspect, the invention provides a device with reduced residual STI corner defects formed by the process of forming a direct silicon bonded substrate wherein a second silicon layer with a second crystal orientation is bonded to a handle substrate with a first crystal orientation, forming a pad oxide layer on the second silicon layer, forming a nitride layer on the pad oxide layer, forming an isolation trench within the direct silicon bonded substrate through the second silicon layer and into the handle substrate, patterning a PMOS region of the direct silicon bonded substrate utilizing photoresist including a portion of the isolation trench, implanting and amorphizing an NMOS region of the direct silicon bonded substrate, removing the photoresist, performing solid phase epitaxy, performing a recrystallization anneal, completing front end processing, and performing back end processing.

In another aspect, the invention provides a method of fabricating a semiconductor device with reduced residual STI corner defects comprising forming a direct silicon bonded substrate wherein a second silicon layer with a second crystal orientation is bonded to a handle substrate with a first crystal orientation forming a pad oxide layer on the second silicon layer, forming a nitride layer on the pad oxide layer, forming an isolation trench within the direct silicon bonded substrate through the second silicon layer and into the handle substrate, patterning a PMOS region of the direct silicon bonded substrate utilizing photoresist including a portion of the isolation trench, implanting and amorphizing an NMOS region of the direct silicon bonded substrate, removing the photoresist, performing solid phase epitaxy, performing a recrystallization anneal, forming an STI liner, completing front end processing and performing back end processing.

DETAILED DESCRIPTION OF EXAMPLE EMBODIMENTS

An example implementation of the principles of the invention is described in the context of an embodiment of a semiconductor device including an STI (shallow trench isolation) region. In the fabrication of semiconductor devices, isolation structures are formed between active areas in which electrical devices such as transistors, memory cells, or the like, are to be formed. The isolation structures, in this case STI structures, are typically formed during initial processing of a semiconductor substrate, prior to the formation of such electrical devices.

A modified amorphization templated recrystallization (ATR) approach for providing planar hybrid orientation substrates can be utilized in the invention. As discussed supra, silicon is easily amorphized by ion implantation and easily recrystallized by subsequent SPE processing and annealing. The inventive solution enables the elimination of STI corner defects without the use of a subsequent anneal at extremely high temperature (e.g., greater than 1250 degrees Celsius) that can generate undesired mechanical stresses resulting in workpiece warping, and the like.

Figure 20:
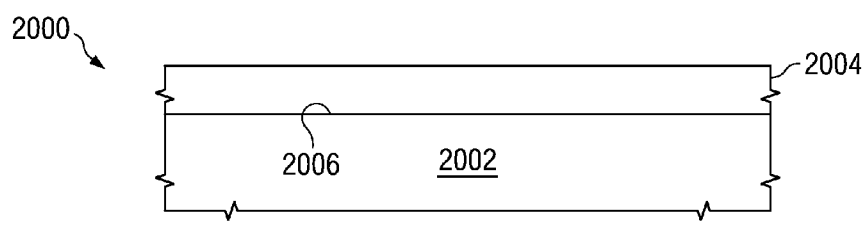
FIGS. 20-24 and 25A are cross-sectional views of the formation of devices utilizing ATR prior to STI formation according to aspects of the invention.

FIGS. 20-24 and 25A illustrate an ATR method for producing reduced defect hybrid orientation silicon substrates. This is accomplished by utilizing ATR prior to STI formation. FIG. 20 shows a starting device 2000 comprising a lower single crystal semiconductor substrate 2002 ("handle substrate") having a first crystal orientation (100) in direct contact with an upper single crystal semiconductor layer 2004 having a second crystal orientation (110) (e.g., Miller Index) different from the first orientation. The upper single crystal semiconductor layer 2004 can have a thickness of approximately 100-300 nm, for example. The interface 2006, which is located between the semiconductor layers 2002 and 2004, is typically formed by a workpiece bonding process (e.g., direct silicon bonded (DSB)) that can be hydrophobic, hydrophilic, and the like, for example. The structure in FIG. 20 is often referred to as a mixed orientation DSB wafer or DSB workpiece. It should be noted that in another embodiment of the invention the lower substrate can have a crystal orientation of (110) and the upper layer a crystalline structure (100) and both orientations, and the like, are contemplated herein.

Figure 21:
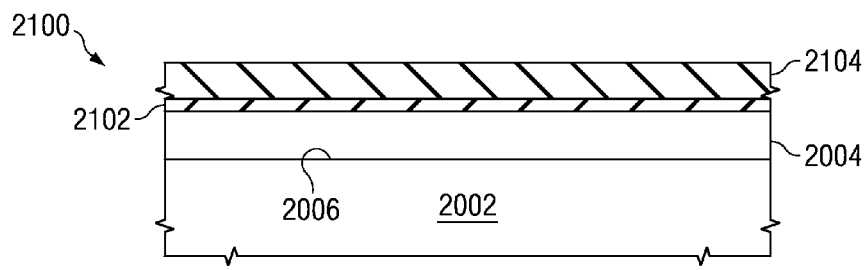
Figure 22:
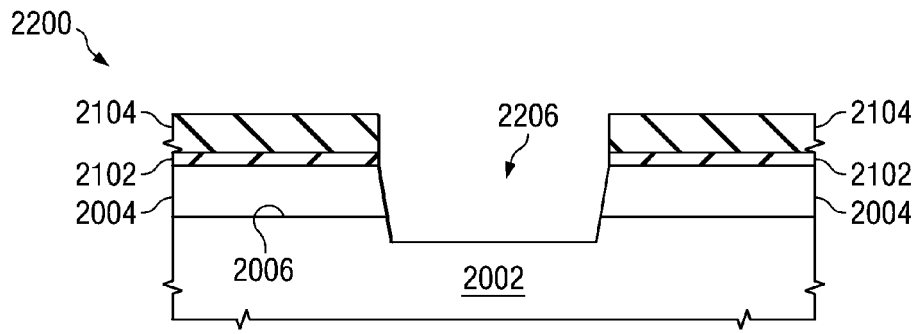

Device 2100 in FIG. 21 is the device 2000 of FIG. 20 wherein a silicon oxide 2102 (e.g., 10-20 nm) can be formed on the silicon (110) layer 2004. The dielectric 2102 is formed on the substrate 2004 outer surface and is often referred to as a "pad-oxide". The pad oxide 2102 acts, for example, as an intermediate layer or barrier between the silicon substrate upper layer 2004 and a silicon nitride layer 2104 that is deposited on top of the pad oxide 2102 in subsequent processing. The nitride layer 2104 (e.g., 150-200 nm) can be deposited using several techniques which include deposition by evaporation, sputtering, chemical-vapor deposition (CVD), and the like. These deposition techniques are well known by those of ordinary skill in the art. The layers, 2102 and 2104, can protect the surface of "active areas" from subsequent chemical mechanical polishing (CMP), for example.

The nitride layer 2104 can provide protection for an electrical device active area formation during shallow trench creation. The nitride layer 2104 can be, for example, SiN, silicon nitride ($Si_3N_4$), reaction bonded silicon nitride (RBSN), hot pressed silicon nitride (HPSN), sintered silicon nitrides (SSN), and the like. The dielectric layer 2102 and the nitride layer 2104 together form what is referred to as a "hard mask". During pattern transfer to an integrated circuit device, the hard mask layer is consumed during an etching process, for example. However, it is to be appreciated that any hard mask techniques may be practiced in this invention, and that other hard mask materials and masking processes are contemplated as falling within the scope of the invention.

A conventional photoresist (not shown) can be applied, for example, and can be utilized to pattern and etch the nitride layer 2104 and the pad oxide layer 2102 in order to result in a patterned and etched device 2200 with a resultant STI trench 2206. The photoresist can be, for example, a solvent-based, light-sensitive resin solution that is uniformly applied, for example, on the nitride layer 2104 of the device 2200, utilizing a spin type process, and the like. The photoresist can, for example, be a chemical, negative photoresist that hardens when exposed to ultraviolet light or other light wavelengths and the unexposed photoresist can be dissolved by employing a developer solvent, leaving openings in the exposed photoresist. Another approach involves utilizing a positive photoresist that is initially insoluble, and when exposed to e.g., UV, mercury light, laser, x-rays, electron beam, etc., becomes soluble. After exposure, the photoresist can create the etch pattern needed to form the active STI trenches 2206 during, for example, reactive ion etching (RIE).

Figure 23:
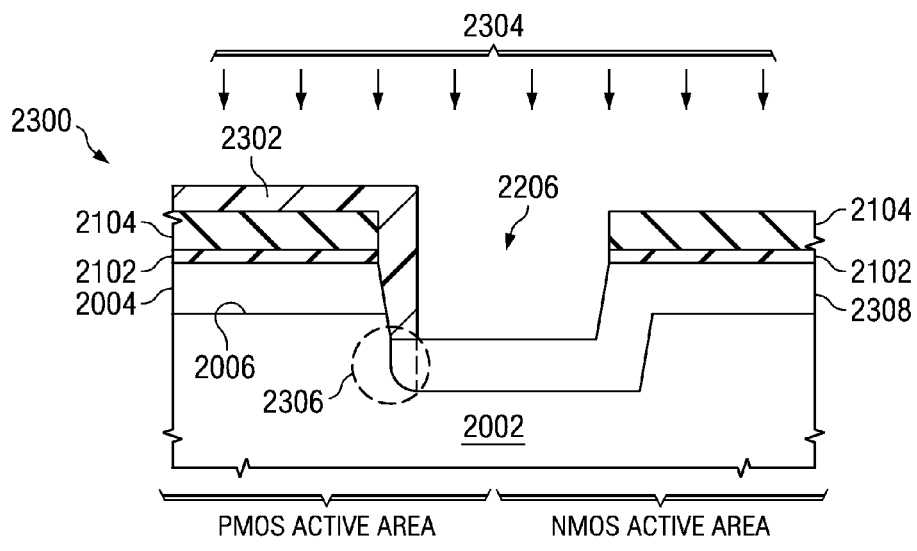

Referring to FIG. 23, a photoresist 2302 can be formed over the PMOS active area as illustrated. The photoresist 2302 can be applied to the device 2300 followed by patterning involving photoresist removal and a standard clean in FIG. 23 that is well known by those of ordinary skill in the art. The device can be implanted 2304 utilizing Si+ and/or Ge+ through the nitride-oxide hard mask, for example. The implant dose and energy can be in the range of 2.5-5.0E15 atoms/cm2 and 200-300 keV, respectively, for example. FIG. 23 shows the device 2300 after the first silicon layer has been amorphized ($\alpha$-Si) by ion implantation 2304 to create amorphous volume 2306 extending past the location of the original bonded interface 2006. Lateral re-growth 2306 takes place under a small portion of the area covered by the photoresist. The amorphized ("$\alpha$-Si") layer 2308 can be approximately 250-350 nm deep, for example.

Figure 24:
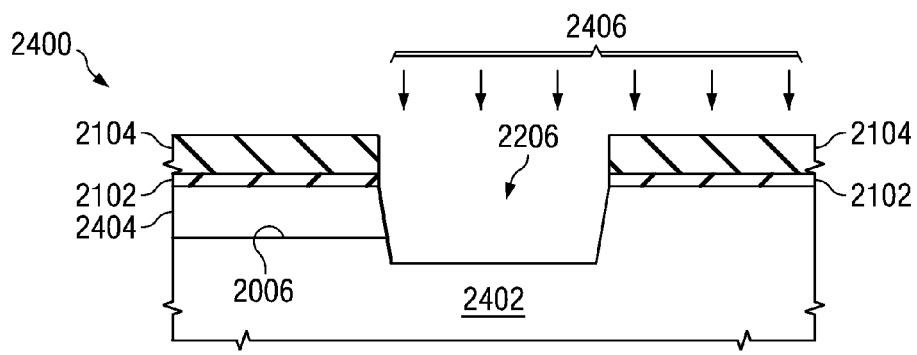

In FIG. 24, the change of the crystal orientation of the top silicon layer 2402 can be realized as an amorphized top layer which will re-grow aligned to the handle workpiece 2002 crystalline structure. SPE can be realized by low temperature anneal in an Ar, $N_2$ or $H_2$ environment, for example. Typical ranges for temperatures can be respectively 400-700 degrees Celsius (° C.). After SPE, an annealing process (e.g., less than 1250 degrees Celsius, 10 sec, $N_2$, Ar or $H_2$ environment) can be performed to reduce residual crystal damage. The damage can be in the form of stable end-of-range damage induced dislocation loops located at the amorphous/silicon interface, STI corner defects, and the like, for example. In order to be able to remove the corner defects without applying extremely high conventional temperature anneals (e.g., greater than 1250 degrees Celsius) the SPE will be conducted before the oxide 2504 filling and oxide lining 2502 of the trench. The "free" sidewall surface of upper single crystal semiconductor layer 2004 (FIG. 24) provides the silicon atoms more freedom in realigning to the handle workpiece crystalline structure during SPE. In other words, the atoms are not constrained at the sidewall surface.

FIG. 24 shows a structure 2400 after a solid phase epitaxy (SPE) 2406. The ion implantation 2304 (FIG. 23) occurs prior to the annealing process. If the ion implantation energy of the impurity atoms is sufficiently high, it can damage the silicon of the surface of the silicon substrate. A damage reducing anneal is sufficient to produce re-growth of the amorphized silicon by solid-phase epitaxy 2406 to restore the surface of the silicon substrate with minimal crystal defects, for example. The SPE process 2406 is well known by those of ordinary skill in the art and can be performed prior to STI sidewall formation. It should be noted that the invention eliminates many of the residual STI corner defects generated in other approaches.

Figure 25A:
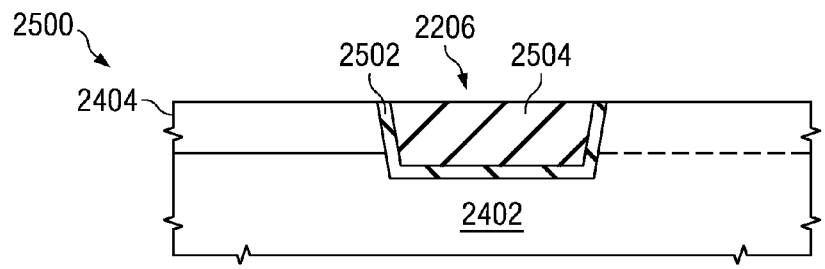

The device 2400 in FIG. 24 continues at FIG. 25A, for example, with the deposition or forming of a dielectric trench liner 2502 that can be formed over the exposed portions of the STI trench 2206. The trench dielectric liner 2502 can be deposited or formed in any suitable process, such as, a thermal growth process at the exposed trench surfaces of the etched STI trench. As discussed supra, the trench dielectric liner 2502 can be deposited to act as a protective layer for the trench, to act as a high purity spacer between the silicon and a fill dielectric 2504, and the like. The trench lining process can be, for example, a thermal process, a LVCVD process, a thermal process bi-layered liner, a chemical oxide process in combination with LPCVD films, and the like. It should be apparent to those of ordinary skill in the art that other trench liner materials (e.g., nitride), multiple isolation liners, no liners at all, and the like are contemplated with this invention.

In a device 2500 of FIG. 25A, for example, the trench 2206 can then be filled with a gap-filling oxide isolation material 2504. The structure is subsequently chemically mechanically polished (CMP) to create a planar STI structure (e.g., approximately 300 nm deep, for example) such that electrical devices (inner active areas) can be formed within regions bounded by the STI, often referred to as moats. Subsequently, the nitride layer can be removed. It should be appreciated that any process known by those of ordinary skill in the art to remove the nitride layer is contemplated within this invention. The isolation nitride, for example, can be removed with phosphoric acid at an elevated temperature and SC1 megasonic processing. In addition, the pad oxide layer has been removed using techniques known by those of ordinary skill in the art. It is to be appreciated that at this point in the process the workpiece will be processed according to usual metal-oxide-semiconductor STI process flows known to those of ordinary skill in the art to complete the first option (ATR prior to STI formation).

Figure 1:
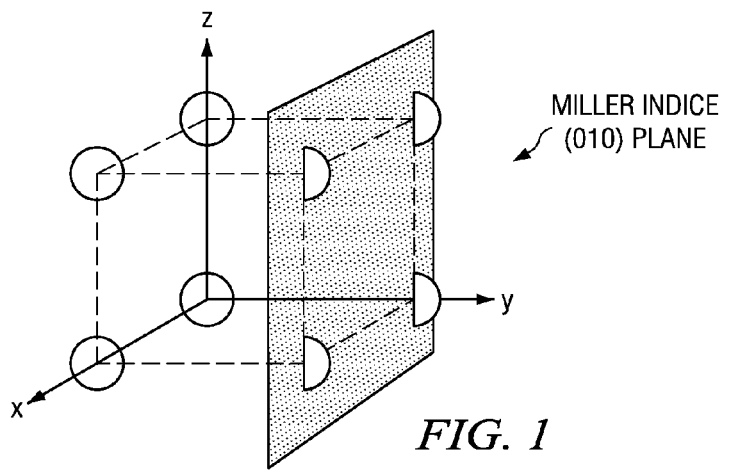
FIGS. 1-3 are perspective views illustrating Miller Index (010), Miller Index (110) and Miller Index (111) according to an aspect of the invention.
Figure 2:
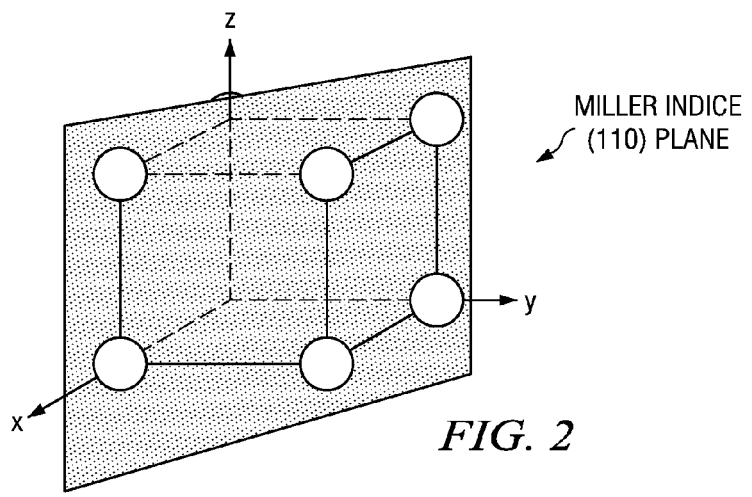
Figure 3:
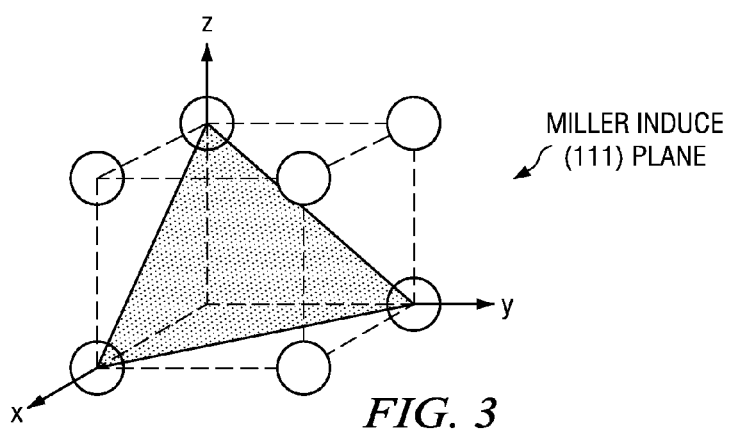
Figure 4:
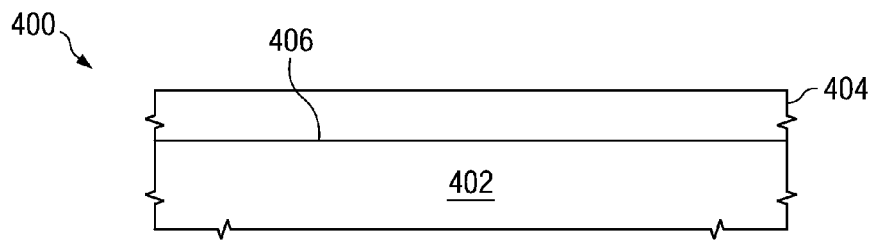
FIGS. 4-6 (Prior Art) are cross-sectional views illustrating conventional ATR structures at various stages in the manufacturing process.
Figure 5:
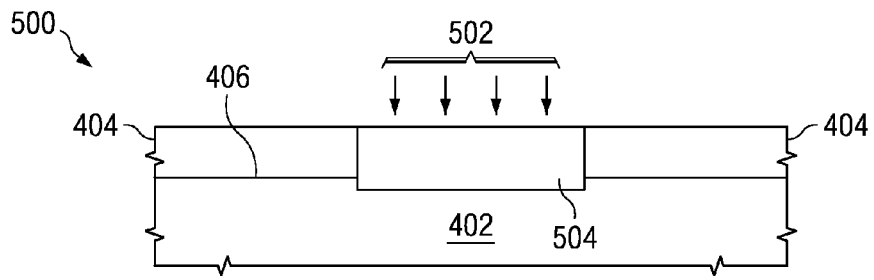
Figure 6:
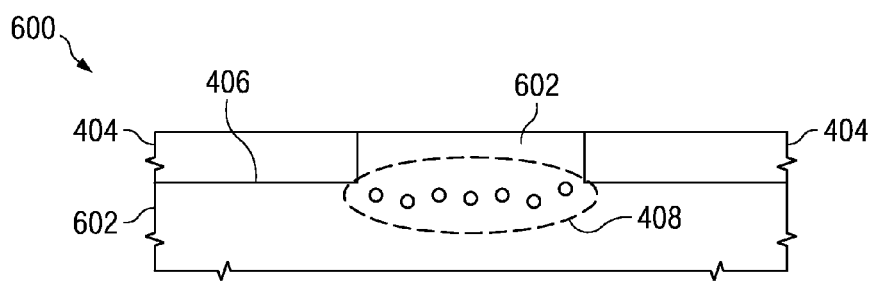
Figure 7:
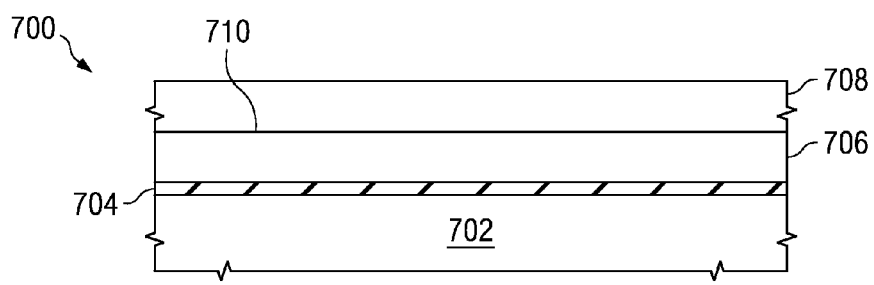
FIGS. 7-10 (Prior Art) are cross-sectional views illustrating a conventional ATR device fabrication.
Figure 8:
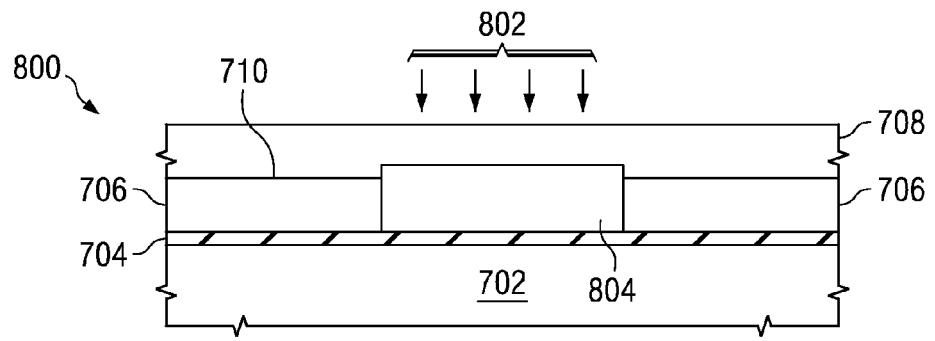
Figure 9:
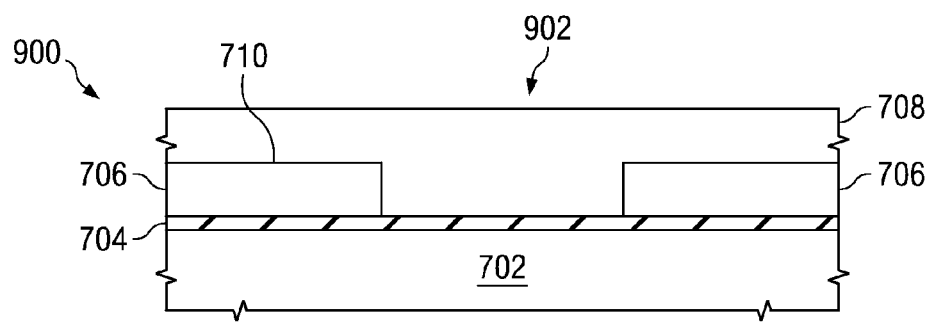
Figure 10:
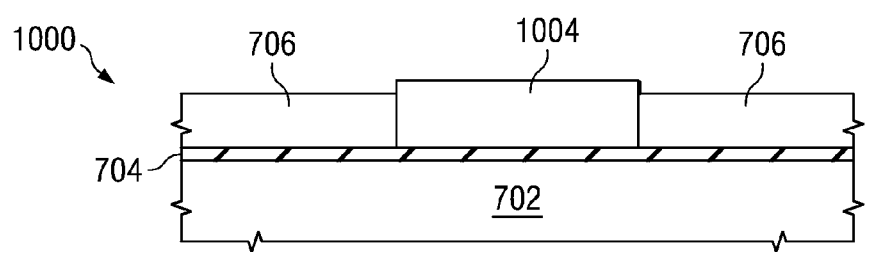
Figure 11:
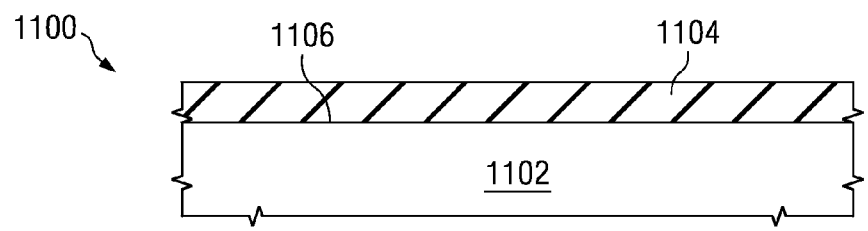
FIGS. 11-13 (Prior Art) are cross-sectional views illustrating a conventional method for forming a device utilizing ATR prior to STI formation.
Figure 12:
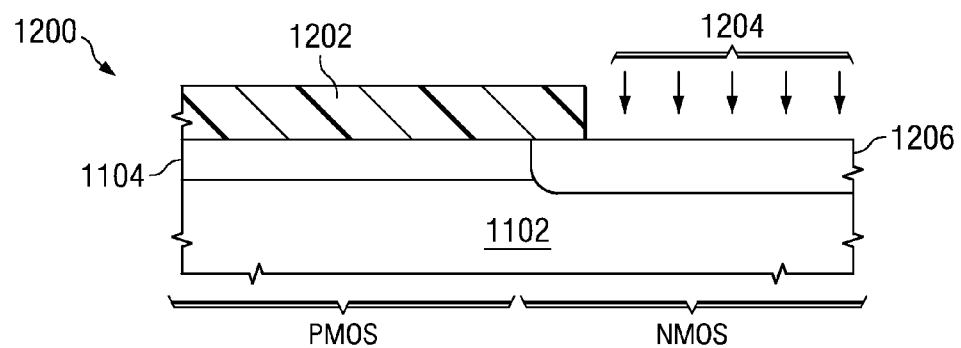
Figure 13:
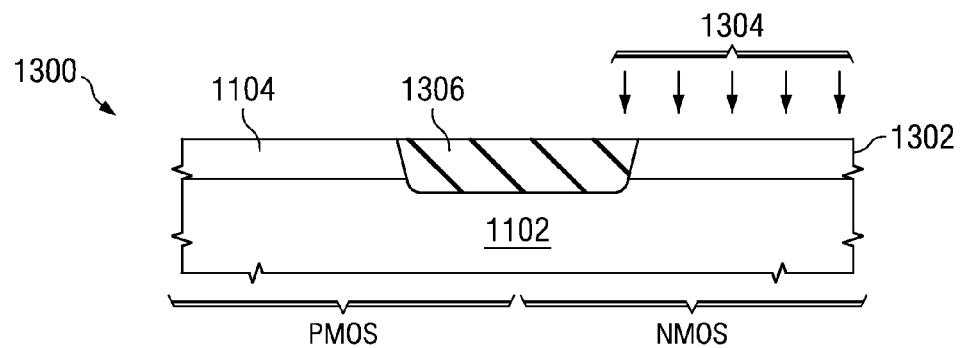
Figure 14A:
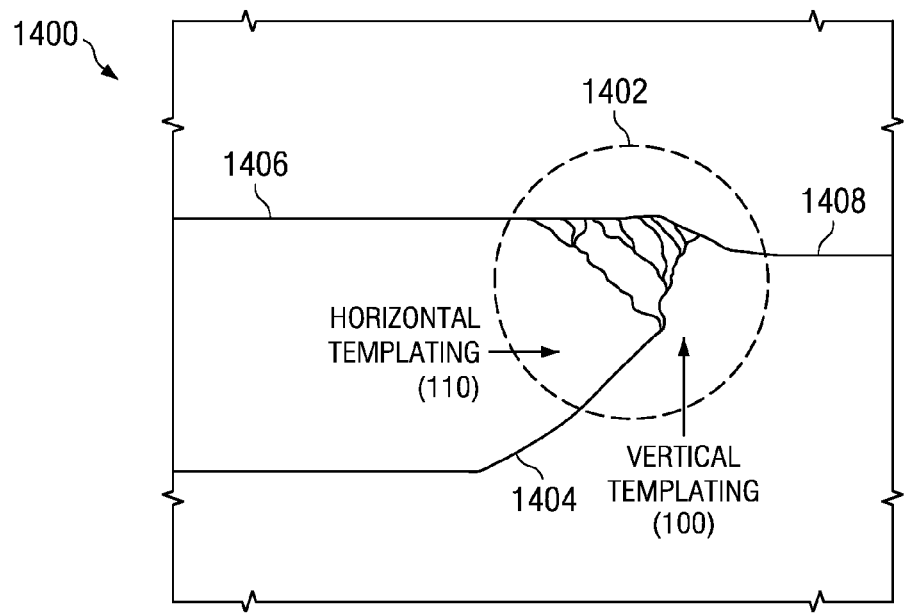
FIGS. 14A, 14B, 15A and 15B (Prior Art) illustrate defects that occur utilizing the conventional method of FIGS. 11-13.
Figure 14B:
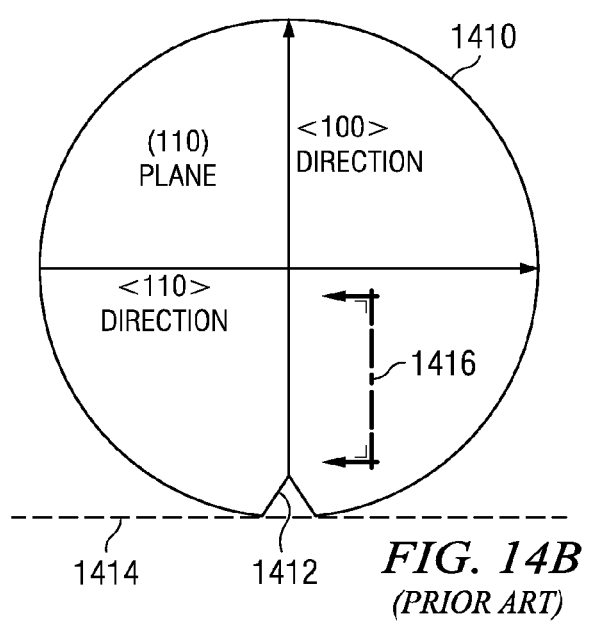
Figure 15A:
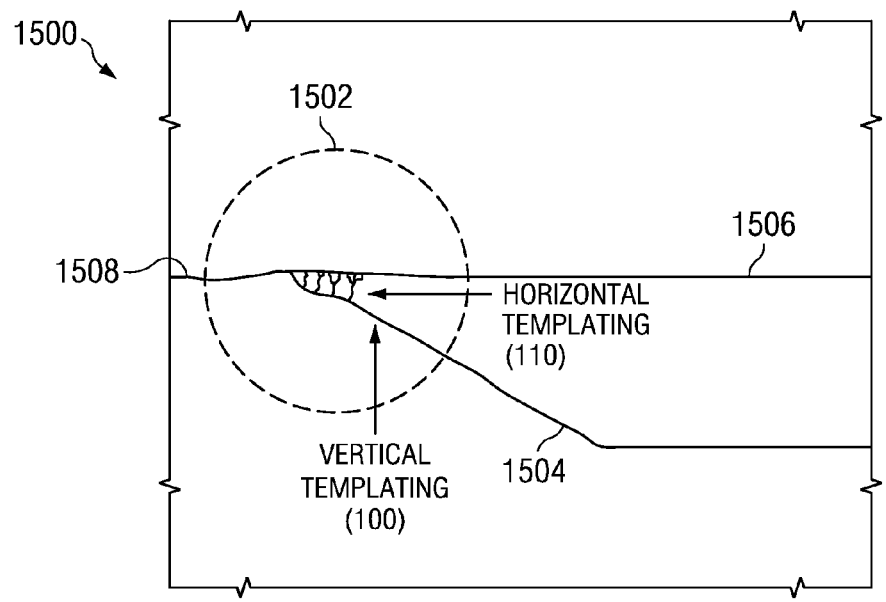
Figure 15B:
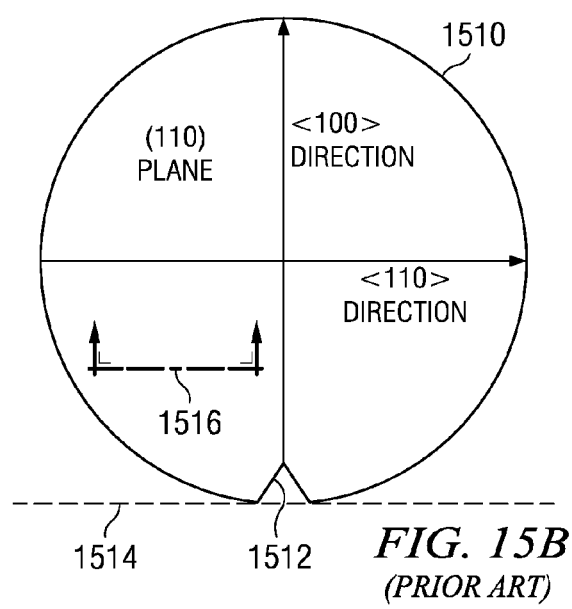
Figure 16:
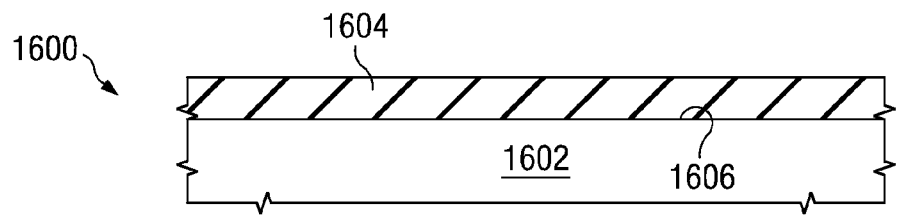
FIGS. 16-18 (Prior Art) are cross-sectional views illustrating a conventional method for forming a device utilizing ATR after STI formation.
Figure 17:
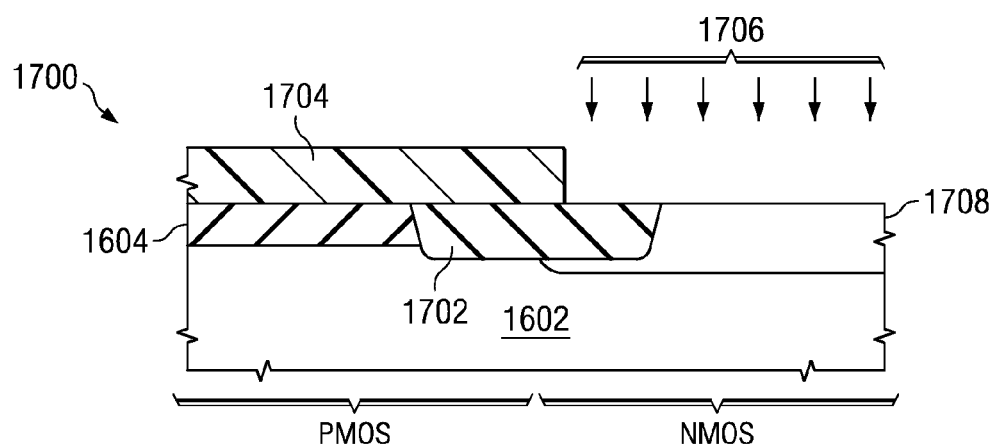
Figure 18:
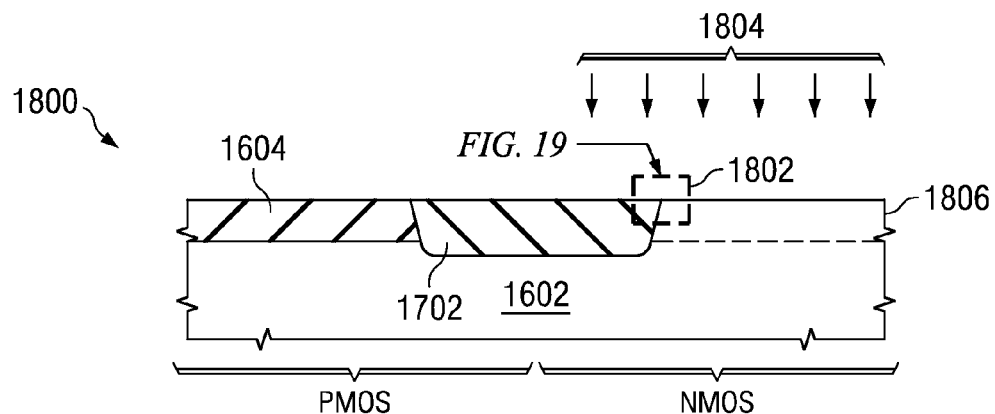
Figure 19:
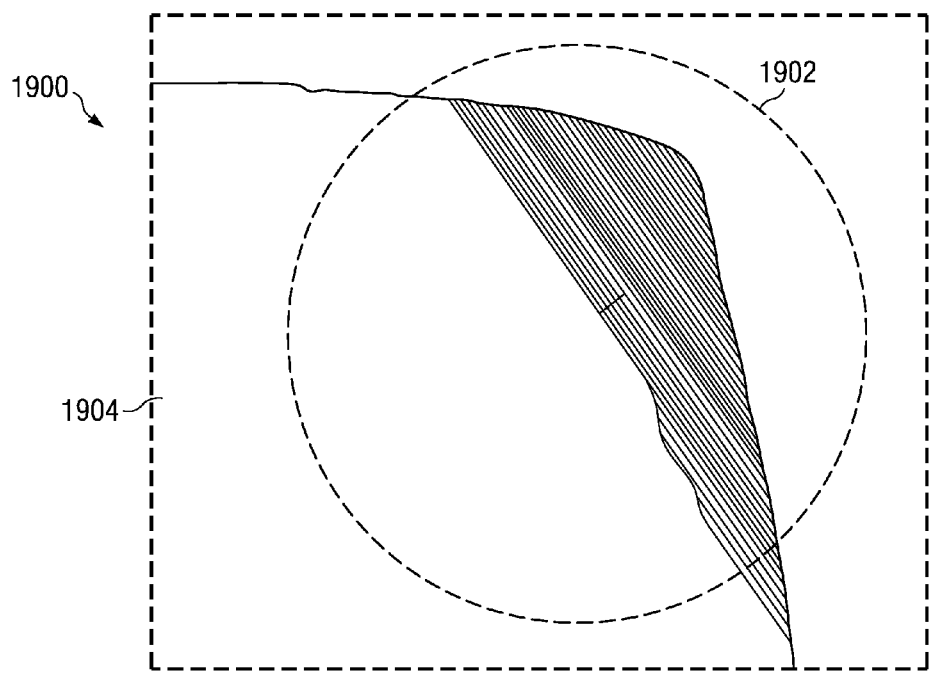
FIG. 19 (Prior Art) illustrates defects that occur utilizing the conventional method of FIGS. 16-18.
Figure 25B:
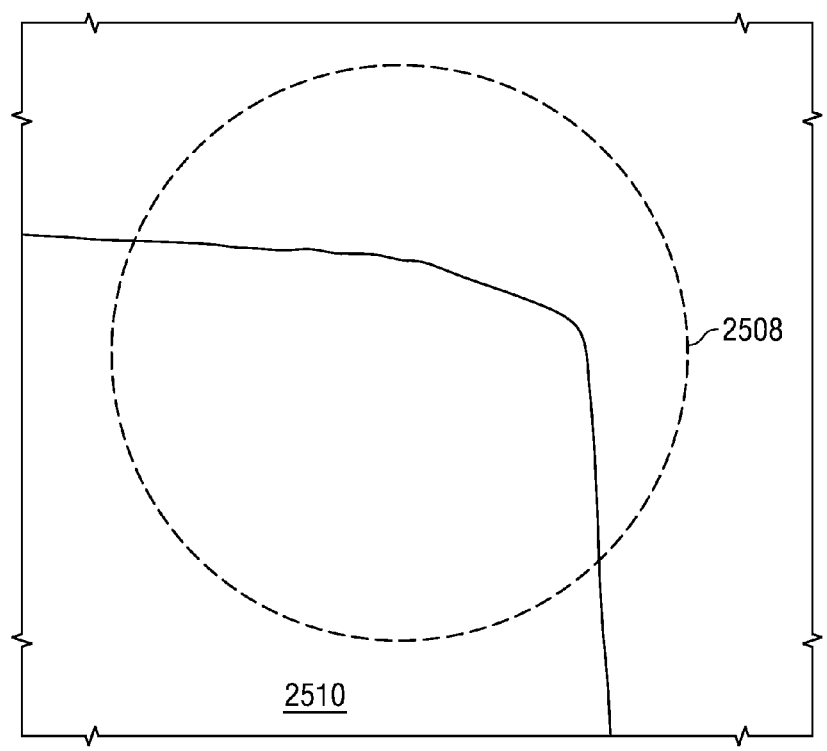
FIG. 25B is an illustration based on a photograph, showing the elimination of defects in a device, according to yet another aspect of the invention.

FIG. 25B is provided by applicants of the invention to show a transmission electron microscopy (TEM) image 2508 of the reduction of border region defects 2510 utilizing ATR after the STI etching process. Comparing the FIG. 25B (associated with the inventive process) to FIG. 19 (prior art approach), the new inventive approach is clearly superior to the prior art approach in terms of defect reduction and/or elimination.

Figure 26:
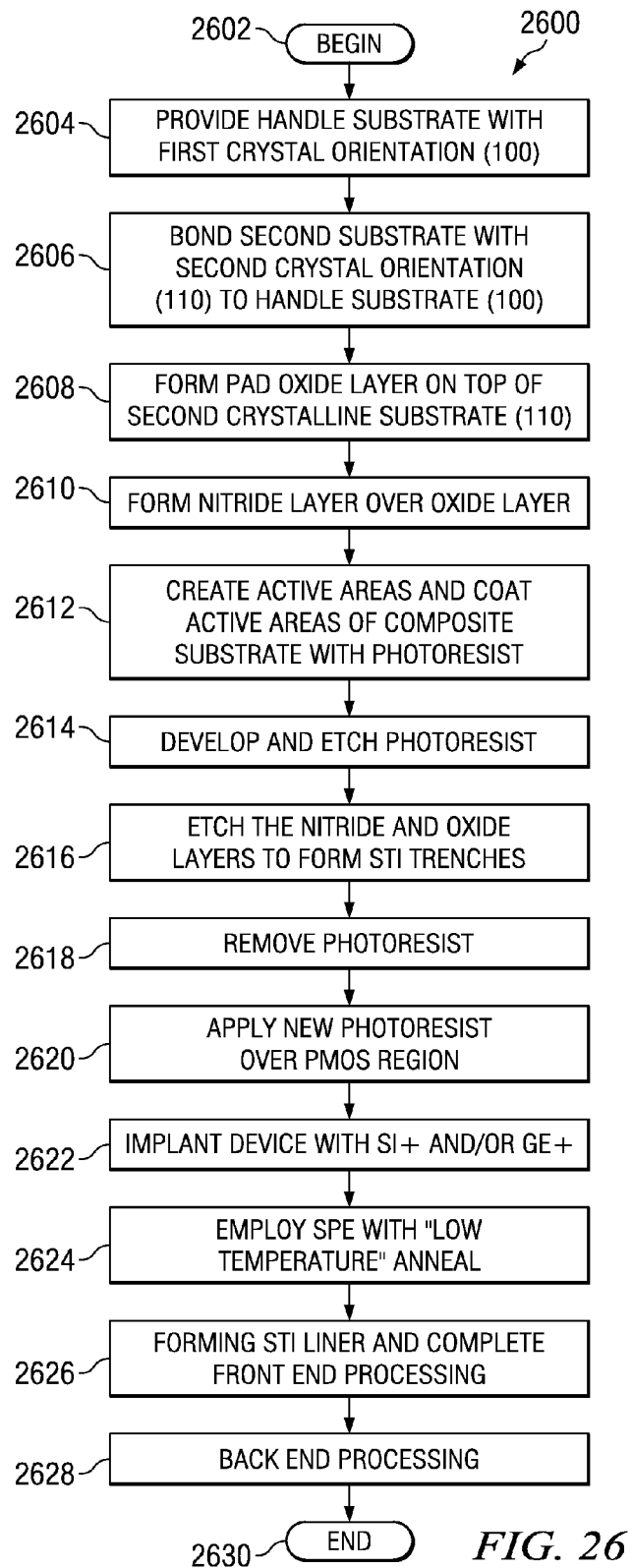
FIG. 26 is a flowchart demonstrating ATR prior to STI formation, according to aspects of the invention.

Referring to FIG. 26, an example method 2600 is illustrated as a flow diagram for fabricating a MOS device in accordance with one or more aspects of the invention. It will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the invention. Furthermore, the methods according to the invention may be implemented in association with the formation and/or processing of structures illustrated and described herein as well as in association with other structures not illustrated. In one example, the method 2600 or variants thereof, may be used in manufacturing CMOS devices, as illustrated and described above with respect to FIGS. 20-24 and 25A.

Beginning at 2602 of FIG. 26, a handle substrate with a first orientation (100) is provided at 2604. A second substrate with a second crystalline orientation (110) is bonded to the handle substrate at 2606. The second crystal semiconductor layer can have a thickness of approximately 100-300 nm, for example. It will be appreciated that the bonding process can be performed utilizing a DSB substrate preparation process as is well known to those of ordinary skill in the art. In one example technique each surface being bonded to another surface can be subjected to a pre-bonding treatment. The pre-bonding treatment can include a cleaning process, an activation process, and the like, of the surfaces to be bonded to together. The cleaning process can include conventional standard clean processes; plasma activated cleaning, and the like. Bonding can occurs via hermetic bonding techniques, non-hermetic bonding techniques, or combinations of these techniques, depending upon the specific approach and/or embodiment. The hermetic techniques include anodic, eutectic, fusion, covalent, and the like. The non-hermetic techniques include epoxy, glue films, liquid crystal polymer (LCP), and others. One of ordinary skill in the art would recognize many other variations, modifications, and alternatives to those presented herein.

At 2608 a pad oxide layer (e.g., 10-20 nm) can be formed over the second substrate (110) utilizing a thermal oxide process, for example. Any appropriate process steps and materials can be employed in the formation of the oxide layer at 2608, including oxidation processes as are well known to those of ordinary skill in the art. At 2610 a nitride layer (e.g., 150-200 nm) can be formed over the oxide layer at 2608. Known deposition processes by those of ordinary skill in the art can be employed in the formation of the nitride layer at 2610. The nitride layer, as discussed in FIG. 21 above can be, for example, silicon nitride, reaction bonded silicon nitride, hot pressed silicon nitride, sintered silicon nitrides, and the like. At 2612 active areas are created in composite substrate and active areas of substrate are coated with a photoresist and subsequently exposed to light through openings in a photoresist mask, for example. The active areas can be created using techniques that are well known to those of ordinary skill in the art. As described in FIG. 22, supra, the photoresist can be, for example, a solvent-based, light sensitive resin solution that softens or becomes soluble when exposed to light (positive photoresist). Any appropriate process steps, materials or energy may be utilized in forming the photolytic mask and exposing the photoresist.

The methodology continues at 2614, where a soluble photoresist (exposed or un-exposed), for example is developed or etched away exposing the outer surface of the nitride layer formed at 2610. The process at 2614 results in a pattern being formed on the substrate allowing for STI trench formation. At 2616 a nitride layer and oxide layer etching process can be performed. As disclosed in FIG. 22. Any suitable fabrication steps or materials can be employed in etching the oxide and nitride layers as are known, for example, wet etching techniques, or dry etching techniques, or both.

At 2616 a recessed active trench can be created in the substrate. The etching procedure may be, for example, a single step or multi-step process, a wet or dry etch process, by which material is removed in the exposed isolation regions in the semiconductor substrate to form the isolation trenches. At 2618 the photoresist is removed. The process of removing photoresist is well known by those of ordinary skill in the art. The oxide and nitride layers can protect the surface of "active areas" from subsequent chemical mechanical polishing (CMP), for example. The nitride layer can provide protection for an electrical device active area formation during shallow trench creation. The nitride layer can be, for example, SiN, silicon nitride ($Si_3N_4$), reaction bonded silicon nitride (RBSN), hot pressed silicon nitride (HPSN), sintered silicon nitrides (SSN), and the like. The example method 2600 continues at 2620, for example, a photoresist can be formed over the PMOS active area as illustrated. The photoresist can be applied to the device followed by patterning involving photoresist removal and a standard clean in that is well known by those of ordinary skill in the art. The device can be implanted utilizing $Si^+$ and/or $Ge^+$ at 2622 through the nitride-oxide hard mask, for example as discussed supra. The implant dose and energy can be in the range of $2.5-5.0E15/cm^2$ and 200-300 keV, respectively, for example. The device after the first silicon layer has been amorphized ($\alpha$-Si) by ion implantation to create an amorphous layer. The amorphized layer can be approximately 250-350 nm deep, for example.

The change of the crystal orientation of the top silicon layer can be realized as an amorphized top layer which will re-grow aligned to the handle workpiece crystalline structure, for example. SPE can be employed at 2624 by a low temperature anneal in an Ar, $N_2$ or $H_2$ environment, for example. Typical ranges for temperatures can be respectively 400-700 degrees Celsius. After SPE, an anneal (e.g., greater than 1050 but less than 1250 degrees Celsius, 10 sec, $N_2$, Ar or $H_2$ environment) can be applied to reduce residual crystal damage. The damage can be in the form of stable end-of-range damage induced dislocation loops located at the amorphous/silicon interface, STI corner defects, and the like, for example. The inventors recognized that by keeping the anneal temperature below 1250 degrees Celsius that wafer warpage defects, and the like would be reduced. In order to be able to remove the corner defects without applying extremely high conventional temperature anneals (e.g., greater than 1250 degrees Celsius) the SPE can be conducted before the oxide lining and oxide filling of the trench. The "free" sidewall surface of the trench provides the silicon atoms more freedom in realigning to the handle workpiece crystalline structure during SPE. The atoms are not constrained and there for can move at the sidewall surface.

This can be followed at 2626 with the deposition or forming of a dielectric trench liner that can be formed over the exposed portions of the STI trench. The trench dielectric liner can be deposited or formed in any suitable process step, such as, a thermal growth process at the exposed trench surfaces, including sidewall recesses and center section of the etched STI trench. As discussed supra, the trench dielectric liner can be deposited to act as a protective layer of the trench, to act as a high purity spacer between the silicon and the fill dielectric, and the like. The trench lining process can be, for example, a thermal process, a LVCVD process, a thermal process bi-layered liner, a chemical oxide process in combination with LPCVD films, and the like. It should be apparent to those of ordinary skill in the art that other trench liner materials (e.g., nitride), multiple isolation liners, no liners at all, and the like are contemplated with this invention. At 2626 the front end processing can be completed, for example. Front end processing can include filling the STI trench with oxide and chemical mechanical polishing, and the like.

The example method 2600 continues at 2628, for example, where back end processing can be completed. The back end processing of CMOS devices is well known by those of ordinary skill in the art and can include forming metal interconnect layers, and the like. The process ends at 2630.

Those skilled in the art to which the invention relates will appreciate that other embodiments and modifications are possible within the scope of the claimed invention.

What is claimed is:

1. A method of fabricating a semiconductor device, comprising:
    forming a direct silicon bonded substrate wherein a second silicon layer with one of a (100) or (110) crystal orientation is bonded to a first silicon layer of a handle substrate with the other of the (100) or (110) crystal orientation;
    forming a pad oxide layer over the second silicon layer;
    forming a nitride layer over the pad oxide layer, wherein the nitride layer is deposited as a non-stressed nitride layer;
    forming an isolation trench within the direct silicon bonded substrate through the non-stressed layer, the second silicon layer and into the first silicon layer;
    after forming the isolation trench, performing a patterned implant to amorphize a region of the second silicon layer;
    performing solid phase epitaxy at a temperature of less than about 700° C. to recrystallize the amorphized region of the second silicon layer to the same crystal orientation as the first silicon layer; and
    after performing the solid phase epitaxy, filling the isolation trench with an isolation material.

2. The method of claim 1, further comprising, after performing the solid phase epitaxy, performing an anneal at a temperature of greater than about 1050° C. but less than 1250° C. to repair residual crystal damage.

3. The method of claim 2, wherein filling the isolation trench with an isolation material comprises growing an oxide liner on sidewalls of the isolation trench, forming a layer of oxide including over the oxide liner to fill the trench, and mechanically planarizing the layer of oxide to remove portions outside the isolation trench.

4. The method of claim 3, wherein the solid phase epitaxy is performed at a temperature of 550-650° C. for a time of 0.6-35 minutes.

5. The method of claim 3, wherein the patterned implant is performed by implanting at least one of silicon or germanium into the second silicon layer.

6. The method of claim 5, wherein the implant is performed using a dosage of 2.5-5.0E15 atoms/cm$^2$ at an energy of 200-300 keV.

7. The method of claim 5, wherein one of an NMOS or PMOS transistor is formed in the amorphized region of the second silicon layer after recrystallization, and the other of the NMOS or PMOS transistor is formed in an unamorphized region of the second silicon layer, with the oxide filled trench serving to isolate the NMOS transistor from the PMOS transistor.

8. The method of claim 1, wherein filling the isolation trench with an isolation material comprises growing an oxide liner on sidewalls of the isolation trench, forming a layer of oxide including over the oxide liner within the trench, and mechanically planarizing the layer of oxide to remove portions outside the isolation trench.

9. The method of claim 1, wherein filling the isolation trench with an isolation material comprises growing an oxide liner on sidewalls of the isolation trench, forming a layer of oxide including over the oxide liner to fill the trench, and mechanically planarizing the layer of oxide to remove portions outside the isolation trench.

10. The method of claim 9, wherein one of an NMOS or PMOS transistor is formed in the amorphized region of the second silicon layer after recrystallization, and the other of the NMOS or PMOS transistor is formed in an unamorphized region of the second silicon layer, with the oxide filled trench serving to isolate the NMOS transistor from the PMOS transistor.

11. The method of claim 1, wherein the solid phase epitaxy is performed at a temperature of 550-650° C. for a time of 0.6-35 minutes.

12. A method of fabricating a semiconductor device, comprising:
    forming a direct silicon bonded substrate wherein a second silicon layer with a (110) crystal orientation is bonded to a first silicon layer of a handle substrate with a (100) crystal orientation;
    forming a hardmask over the second silicon layer, the hardmask comprising a silicon oxide layer and a silicon nitride layer, wherein the nitride layer is deposited as a non-stressed nitride layer;

patterning the hardmask with an opening, and etching the second silicon layer and at least a portion of the first silicon layer through the opening including the non-stressed nitride layer to form an isolation trench to separate PMOS and NMOS active areas within the direct silicon bonded substrate;

after forming the isolation trench, performing a patterned implant to amorphize the second silicon layer selectively in the NMOS active area;

performing solid phase epitaxy at a temperature of less than about 700° C. to recrystallize the amorphized region of the second silicon layer to the same crystal orientation as the first silicon layer; and after performing the solid phase epitaxy, filling the isolation trench with an isolation material by growing an oxide liner on sidewalls of the isolation trench, forming a layer of oxide including over the oxide liner within the trench, and mechanically planarizing the layer of oxide to remove portions outside the isolation trench.

13. The method of claim 12, wherein the patterned implant comprises implanting at least one of silicon or germanium through the hardmask.

14. The method of claim 13, wherein the implant of at least one of silicon or germanium is performed using a dosage of 2.5-5.0E15 atoms/cm$^2$ at an energy of 200-300 keV.

15. The method of claim 14, further comprising, after performing the solid phase epitaxy, performing an anneal at a temperature of greater than about 1050° C. but less than 1250° C. to repair residual crystal damage.

16. The method of claim 15, wherein the solid phase epitaxy is performed at a temperature of 550-650° C. for a time of 0.6-35 minutes.

17. The method of claim 12, wherein the solid phase epitaxy is performed at a temperature of 550-650° C. for a time of 0.6-35 minutes; and further comprising, after performing the solid phase epitaxy, performing an anneal at a temperature of greater than about 1050° C. but less than 1250° C. to repair residual crystal damage.

18. The method of claim 12, wherein the second silicon layer is bonded to the first silicon layer at an interface; and the patterned implant also amorphizes a portion of the first silicon layer to create an amorphous layer extending below the location of the interface.

19. The method of claim 18, wherein the amorphized portion of the first silicon layer comprises a portion located below the isolation trench.

20. The method of claim 19, wherein the second silicon layer has a thickness of approximately 100-300 nm and the amorphous layer is approximately 250-350 nm deep.

21. The method of claim 1, wherein the nitride layer is deposited using a technique selected from the group consisting of:
   evaporation;
   sputtering; and
   chemical-vapor deposition.

22. The method of claim 12, wherein the nitride layer is deposited using a technique selected from the group consisting of:
   evaporation;
   sputtering; and
   chemical-vapor deposition.

* * * * *